United States Patent
Liu et al.

(10) Patent No.: US 6,845,260 B2
(45) Date of Patent: Jan. 18, 2005

(54) AUTOMATIC VESSEL INDENTIFICATION FOR ANGIOGRAPHIC SCREENING

(75) Inventors: Kecheng Liu, Solon, OH (US); Jasjit S. Suri, Mayfield Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 366 days.

(21) Appl. No.: 09/908,009

(22) Filed: Jul. 18, 2001

(65) Prior Publication Data

US 2003/0166999 A1 Sep. 4, 2003

(51) Int. Cl.$^7$ ................................................ A61B 5/05
(52) U.S. Cl. ...................................... 600/410; 600/407
(58) Field of Search ............................... 600/410, 419, 600/407, 420; 324/306, 307, 308, 309

(56) References Cited

U.S. PATENT DOCUMENTS

| | | | |
|---|---|---|---|
| 4,777,957 A | * 10/1988 | Wehrli et al. | 600/413 |
| 5,148,809 A | * 9/1992 | Biegeleisen-Knight et al. | 600/443 |
| 5,348,012 A | 9/1994 | Kojima | 128/653.3 |
| 5,417,213 A | 5/1995 | Prince | 600/413 |
| 5,492,124 A | 2/1996 | Purdy | 600/413 |
| 5,494,041 A | * 2/1996 | Wilk | 600/425 |
| 5,590,654 A | 1/1997 | Prince | 600/420 |
| 5,713,358 A | 2/1998 | Mistretta et al. | 600/420 |
| 5,873,825 A | 2/1999 | Mistretta et al. | 600/401 |
| 6,043,655 A | 3/2000 | Makita et al. | 324/309 |
| 6,073,042 A | 6/2000 | Simonetti | 600/420 |
| 6,137,898 A | * 10/2000 | Broussard et al. | 382/132 |
| 6,169,917 B1 | * 1/2001 | Masotti et al. | 600/407 |
| 6,192,264 B1 | 2/2001 | Foo et al. | 600/413 |
| 6,246,897 B1 | * 6/2001 | Foo et al. | 600/413 |
| 6,337,992 B1 | * 1/2002 | Gelman | 600/425 |
| 6,377,835 B1 | * 4/2002 | Schoenberg et al. | 600/419 |
| 6,662,038 B2 | * 12/2003 | Prince | 600/420 |

FOREIGN PATENT DOCUMENTS

| | | |
|---|---|---|
| WO | WO 00/40990 | 7/2000 |
| WO | WO 00/79481 | 12/2000 |

OTHER PUBLICATIONS

Reuzé, et al. "3–D Vessel Tracking and Quantitation in Angio MRI" Proceed. Of 1993 IEEE 19$^{th}$ Annual Northeast Bioengineering Conference, Newark NJ Mar. 18–19, 1993, pp. 43–44 XP010140312.

(List continued on next page.)

*Primary Examiner*—Daniel Robinson
(74) *Attorney, Agent, or Firm*—Fay, Sharpe, Fagan, Minnich & McKee LLP

(57) ABSTRACT

A magnetic resonance angiographic method includes acquiring (70) high resolution volume image data comprising data (74) corresponding to a plurality of high resolution image slices, and acquiring (72) data corresponding to at least one vessel identification image slice (76), said acquired data having selectively enhanced contrast for one of arteries and veins. A high resolution volume image representation (80) is reconstructed from the acquired high resolution volume image data (74). At least one vessel identification slice image representation (82) is reconstructed from the acquired data corresponding to at least one vessel identification image slice (76). At least one of an artery starting point (86) and a vein starting point (88) is identified based on the vessel identification slice image representation (82). Preferably, the method further includes defining (124) an initial surface that encloses the at least one starting point (126), and iteratively growing (128) the initial surface (126) until the surface essentially coincides with the boundaries of the vascular system.

38 Claims, 8 Drawing Sheets

OTHER PUBLICATIONS

Xuan, et al. "Segmentation of Magnetic Resonance Brain Image: Integrating Region Growing and Edge Detection", Proceed. of Int'l. Conference on Image Processing, Washington, Oct. 23 Oct. 26, 1995, IEEE Comp. Soc. Press vol. 3, Oct. 23, 1995, pp. 544–547 XP010197242.

Krissen, et al. "Model Based Multiscale Detection of 3D Vessels", Biomedical Image Analysis, 1998, Proceed. Workshop on Santa Barbara, CA IEEE Comput. Soc. Jun. 26, 1998, pp. 202–210 XP010291409.

Simonetti, et al. "A Method of Distinguishing Arteries and Veins in Intra–Vascular Contrast Agent Enhanced MR Angiography", Proceed. Of Int'l. Soc. For Mag. Res. In Medicine, $6^{th}$ Scientific Meeting & Exhibition, ISMRM '98, Sydney Apr. 18 Apr. 28, 1998, vol. 1, Apr. 18, 1998, p. 777 XP002136099.

Lei, et al. "Artery–Vein Separation Using MR Angiographic Data: in 25 Patients", Proceed. Of Int'l. Soc. For Mag. Res. In Medicine, $7^{th}$ Scientific Meeting & Exhibition, vol. 2, May 22, 1999, p. 1235 XP002218153.

Cline, et al. "3D Reconstruction of the Brain From Magnetic Resonance Images Using a Connectivity Algorithm", Mag. Res. Imag. vol. 5, pp. 345–352 1987.

Alexander,. et al. "A Median Filter for 3D FAST Spin Echo Black Blood Images of Cerebral Vessels", Mag. Res. in Medicine 43:310–313 (2000).

Tizon, et al. "Improving Visualization of Blood Pool Agent MRA With Virtual Contrast Injection", Proc. Intl. Soc. Mag. Reson. Med. 8 (2000) p. 1535.

Sonka, et al. "Feasilibity of Automated Separation of Arteries and Veins Using a Graph Searching Technique", ISMRM 1999.

Lei, et al. "Artery–Vein Separation Using MR Angiographic Data: in 25 Patients", ISMRM 1999.

Zhang, et al. "Contrast–Enhanced MRA Imaging Time–Sense Artery and Vein Separation", Proc. Intl. Soc. Mag. Reson. Med. 8 (2000) p. 1539.

Mazaheri, et al. "Vessel Segmentation in 3D MR Angiography Using Time Resolved Acquisition Curves", ISMRM 1999.

Bock, et al. "Artery–Vein Separation in 3D Contrast Enhanced Pulmonary MRA Using Correlation Anaysis", ISMRM 1999.

Wang, et al. "Artery and Vein Separation Using Susceptibility Dependent Phase in Contrast–Enhanced MRA", Journ. of Mag. Res. Imag. 12:661–670 (2000).

Becker, et al., "Artery–Vein Separation of MRA Images With Blood Pool Contrast Agents", Proc. Intl. Soc. Mag. Reson. Med. 9 (2001) p. 1921.

* cited by examiner

AUTOMATIC VESSEL INDENTIFICATION FOR ANGIOGRAPHIC SCREENING

BACKGROUND OF THE INVENTION

The present invention relates to the imaging and magnetic resonance arts. It particularly relates to magnetic resonance angiography and will be described with particular reference thereto. However, the invention will also find application in the imaging of other tubular structures and networks in which similar tubular structures and networks are advantageously differentiated.

Angiography relates to the imaging of blood vessels and blood vessel systems. Angiography enables improved surgical planning and treatment, improved diagnosis and convenient non-invasive monitoring of chronic vascular diseases, and can provide an early warning of potentially fatal conditions such as aneurysms and blood clots.

Angiography is performed using a number of different medical imaging modalities, including biplane X-ray/DSA, magnetic resonance (MR), computed tomography (CT), ultrasound, and various combinations of these techniques. Magnetic resonance angiography (MRA) can be performed in a contrast enhanced mode wherein a contrast agent such as Gadolinium-Dithylene-Triamine-Penta-Acetate is administered to the patient to improve vascular MR contrast, or in a non-contrast enhanced mode. Vascular contrast is typically obtained by imaging the flowing blood using MR imaging techniques such as time of flight (TOF), black-blood, phase contrast, T2, or T2* imaging.

The TOF method is prevalent in MRA. A TOF imaging sequence typically includes the steps of exciting a magnetic resonance in a first tissue slice using a 90° RF pulse, followed by applying a 180° phase-refocusing RF pulse to a nearby second slice. There is a time delay correlated to blood flow speed and direction between the 90° and 180° RF pulses. Blood that has flowed from the first slice into the second slice during the time delay experiences both the 90° excitation pulse and the 180° refocusing pulse and so produces a spin echo that is selectively imaged in the TOF technique. TOF as well as most other MRA methods produce a gray scale three-dimensional image in which the blood vessels (or the blood within the blood vessels) appear either brighter (white blood angiographic techniques) or darker (black blood angiographic techniques) than the surrounding tissues.

Analysis and interpretation of the unprocessed gray scale MRA image is complicated by a number of factors. Complexity arises because blood vessel networks in the human body are highly intricate, and a particular image will typically include tortuous or occluded blood vessels, shape variability, "S"-turns, regions of very high blood vessel densities, a wide range of blood vessel diameters, and gaps in blood vessels that complicate tracking. The MRA data acquisition introduces additional complications such as misleading gray scales due to limited dynamic range, partial volume averaging, and the like.

A particularly difficult problem in MRA data interpretation is differentiation of the vascular types, i.e. the arteries and the veins, in the image. Medical personnel often desire two images, namely an arteriogram that displays only the arteries and a venogram that displays only the veins. However, most MRA techniques do not provide an appreciable differentiation between the arterial and the venous vascular sub-systems. In the prior art, vessel type identification is typically achieved using two techniques: selective data acquisition, and post-acquisition image processing to differentiate the arteries and the veins.

Selective data acquisition is usually applied to the time-of-flight (TOF) methods in which a pre-saturation slab is placed either superior or inferior of the imaging volume in order to suppress the signal from either the veins or the arteries. Another selective acquisition method employs ECG gating and the phase contrast method which encodes blood flow velocity during the systolic and diastolic phases of the heart pumping cycle to differentiate the arteriogram and the venogram based on the sign and magnitude of the phase of the generated image data. Both the TOF and phase contrast methods assume that the blood flow direction in the image volume definitively differentiates between venous flow and arterial flow. Temporal differentiation has also been proposed for contrast enhanced MRA. This method uses the difference of circulation time in the arterial and venous vascular systems. By measuring and knowing this time difference for all areas of the imaged volume, the arteriogram and the venogram can be separately acquired.

Selective data acquisition methods have several disadvantages. Scan time is increased because the arteriogram and venogram are separately acquired, effectively doubling the acquisition time. The methods typically perform poorly when the imaging volume includes circulation turning points, as in the case of the head and other body extremities. Near these turning points veins often are improperly imaged in the arteriogram, and/or the venogram has poor contrast, e.g. the inflows are suppressed. Since discrimination of arteries and veins in contrast-enhanced MRA is mainly accomplished by careful selection of the time delay between the first and second passes, the image quality is very sensitive to this timing.

Another disadvantage is that the pre-saturation pulses used in many selective acquisition methods typically greatly increases the specific absorption ratio (SAR). The elevated SAR in pre-saturation techniques is particularly problematic for imaging at high magnetic field strengths. Pre-saturation reduces the effective sampling window which forces a higher sampling bandwidth to be used. Pre-saturation methods are also less effective for black-blood based MRA due to the complexity of the blood flow pattern.

The post-acquisition processing methods include manual identification by a user. Manual identification can use a single slice that preferably intersects the primary or root artery of the arterial system. Alternatively, every slice is analyzed by the user. Manual methods have the disadvantages of slowing down the image analysis process, introducing an element of human error to that process, and requiring operators with sufficient anatomical knowledge of the imaged area of the body to make correct manual vascular identifications.

Automated methods for post-acquisition differentiation of arteries and veins typically include the disadvantage of being restricted in application to only certain MRA imaging methods, for example only phase-contrast MRA or only contrast enhanced MRA. In particular, these post-acquisition processing methods are often incompatible with black-blood based MRA techniques. The black-blood techniques have advantages over white-blood-based MRA in that black-blood techniques typically provide more accurate vascular morphology versus TOF MRA.

The present invention contemplates an improved MRA system and method which overcomes the aforementioned limitations and others.

SUMMARY OF THE INVENTION

According to one aspect of the invention, a magnetic resonance angiographic method is disclosed. High resolution volume image data comprising data corresponding to a high resolution image volume is acquired. Data corresponding to at least one vessel identification image slice is acquired, said acquired data having selectively enhanced contrast for one of arteries and veins. A high resolution volume image representation is reconstructed from the acquired high resolution volume image data. At least one vessel identification slice image representation is reconstructed from the acquired data corresponding to at least one vessel identification image slice. At least one of an artery starting point and a vein starting point is identified in the high resolution image based on the vessel identification slice image representation.

Preferably, the step of acquiring data corresponding to at least one vessel identification image slice is interspersed in amongst the acquiring of the high resolution volume image data.

The step of acquiring data corresponding to at least one vessel identification image slice preferably includes one of acquiring data using selective pre-saturation to provide the selectively enhanced contrast for one of arteries and veins, and acquiring time-of-flight MRA data using selective pre-saturation to provide the selectively enhanced contrast for one of arteries and veins.

The step of acquiring data corresponding to at least one vessel identification image slice preferably includes acquiring the at least one vessel identification image slice at a data acquisition rate corresponding to less than or about one second per slice.

Preferably, the step of acquiring data corresponding to at least one vessel identification image slice includes acquiring data in a region corresponding to a root of one of an artery and a vein.

The step of acquiring data corresponding to at least one vessel identification image slice preferably includes acquiring data corresponding to at least one vessel identification image slice wherein the acquired vessel identification image slice corresponds spatially with one of a plurality of slices of the high resolution image. The acquisition of data for the identification image slice and the acquisition of data for the corresponding high resolution image slice are preferably interspersed. The step of identifying at least one of an artery starting point and a vein starting point based on the vessel identification slice image representation can include identifying at least one artery starting point based on the vessel identification slice image representation, and identifying at least one vein starting point based on comparing the high resolution image slice that corresponds spatially with the vessel identification slice image representation with at least one of the vessel identification slice image representation and the at least one artery starting point. Alternatively, the step of identifying at least one of an artery starting point and a vein starting point based on the vessel identification slice image representation can include identifying at least one vein starting point based on the vessel identification slice image representation, and identifying at least one artery starting point based on comparing the high resolution image slice that corresponds spatially with the vessel identification slice image representation with at least one of the vessel identification slice image representation and the at least one vein starting point.

The method preferably further includes tracking in three dimensions the vascular sub-system starting at the at least one starting point. The tracking step preferably further includes defining an initial surface that encloses the at least one starting point, and iteratively growing the initial surface until the surface essentially coincides with the boundaries of the vascular system. The step of defining an initial surface that encloses the at least one starting point preferably includes computing a plurality of maximum intensity projections (MIP's), computing the apparent diameter of a vessel corresponding to the starting point in each of the MIP's, selecting the minimum apparent diameter, and defining the initial surface as a spherical surface centered on the starting point whose radius is about one-half the selected minimum apparent diameter.

The step of iteratively growing the initial surface until the surface essentially coincides with the boundaries of the vascular system preferably includes calculating a growth direction, integrating a growth velocity based on regional gray scale information, moving the surface in the growth direction by a distance corresponding to the growth velocity, and repeating the calculating, integrating, and moving until the surface essentially coincides with the boundaries of the vascular system. The step of calculating a growth direction preferably includes calculating at least one Hessian matrix, calculating eigenvalues and eigenvectors of the at least one Hessian matrix, and calculating the growth direction as the direction corresponding to the minimum eigenvalue.

The method preferably further includes smoothing the high resolution volume image representation using an edge-preserving three-dimensional gray scale smoothing method.

The method preferably further includes encountering, during the iterative growing, a vascular branching point having a first branch and at least one additional branch, tagging a point corresponding to the at least one additional branch, continuing the iterative growing along the first branch, returning to the tagged point and repeating the steps of defining an initial surface and iteratively growing the initial surface at the tagged point wherein the iterative growing occurs along the at least one additional branch, and repeating the returning step until all tagged points have been visited.

Preferably, the step of acquiring data corresponding to at least one vessel identification image slice includes acquiring data corresponding to a plurality of vessel identification slices, said vessel identification slices being interspersed at a plurality of selected points.

According to another aspect of the invention, a magnetic resonance angiographic method is disclosed. High resolution volume image data comprising data corresponding to a high resolution image volume is acquired. A high resolution volume image representation is reconstructed from the acquired high resolution volume image data. At least one of an artery starting point and a vein starting point is identified. An initial surface that encloses the at least one starting point is defined. The initial surface is iteratively grown until the surface conforms with the boundaries of the vascular system.

The step of defining an initial surface that encloses the at least one starting point preferably includes computing a plurality of maximum intensity projections (MIP's), computing the apparent diameter of a vessel corresponding to the starting point in each of the MIP's, selecting the minimum apparent diameter, and defining the initial surface as a spherical surface centered on the starting point whose radius is about one-half the selected minimum apparent diameter.

The step of iteratively growing the initial surface until the surface essentially coincides with the boundaries of the vascular system preferably includes calculating a growth direction, integrating a growth velocity based on regional gray scale information, moving the surface in the growth direction by a distance corresponding to the growth velocity, and repeating the calculating, integrating, and moving until the surface conforms with the boundaries of the vascular system. The step of calculating a growth direction preferably includes calculating at least one Hessian matrix, calculating eigenvalues and eigenvectors of the at least one Hessian matrix, and calculating the growth direction as the direction corresponding to the minimum eigenvalue.

The method preferably further includes smoothing the high resolution volume image representation using an edge-preserving three-dimensional gray scale smoothing method.

The step of identifying at least one of an artery starting point and a vein starting point preferably includes: acquiring data corresponding to at least one vessel identification image slice, said acquired data having selectively enhanced contrast for one of arteries and veins relative to the other; reconstructing at least one vessel identification slice image representation from the acquired data corresponding to at least one vessel identification image slice; and identifying at least one of an artery starting point and a vein starting point based on the vessel identification slice image representation. The step of acquiring data corresponding to at least one vessel identification image slice preferably includes acquiring data corresponding to at least one vessel identification image wherein said data acquiring is interspersed in amongst the acquiring of the high resolution volume image data.

The step of acquiring data corresponding to at least one vessel identification image slice preferably includes one of acquiring data using selective pre-saturation to provide the selectively enhanced contrast for one of arteries and veins, and acquiring time-of-flight MRA data using selective pre-saturation to provide the selectively enhanced contrast for one of arteries and veins.

The step of acquiring data corresponding to at least one vessel identification image slice preferably includes acquiring data corresponding to at least one vessel identification image slice wherein the acquired vessel identification image slice corresponds spatially with a slice of the high resolution image representation. The step of identifying at least one of an artery starting point and a vein starting point based on the vessel identification slice image representation preferably includes identifying at least one starting point of a first vessel type corresponding to one of an artery and a vein based on the vessel identification slice image representation, and identifying at least one starting point corresponding to a second vessel type based on comparing the vessel identification slice image representation with the corresponding high resolution image slice.

The step of acquiring data corresponding to at least one vessel identification image slice preferably includes acquiring data corresponding to a plurality of vessel identification slices, said vessel identification slices being disposed in at least one of different locations and orientations within the high resolution image volume.

According to yet another aspect of the invention, a magnetic resonance angiography apparatus is disclosed. A magnetic resonance apparatus acquires magnetic resonance angiographic data for generating high resolution volume angiographic k-space data and low resolution two-dimensional vessel identification angiographic k-space data. A reconstruction processor reconstructs the volume angiographic k-space data into a high resolution three-dimensional image representation. The reconstruction processor reconstructs the two-dimensional vessel identification angiographic k-space data into a vessel identification slice image representation. A post-acquisition vascular processor identifies at least one of an artery starting point and a vein starting point in the high resolution image representation based on the vessel identification slice image representation, and grows the identified starting point in the high resolution image representation into one of a three-dimensional arteriogram and a three-dimensional venogram.

Optionally, the apparatus further includes a means for administering a magnetic contrast agent to an associated patient, whereby the acquired magnetic resonance angiographic data includes contrast-enhanced magnetic resonance angiographic data.

One advantage of the present invention is that it improves scan time by acquiring both the venogram and the arteriogram simultaneously in a single image rather than as two selective images.

Another advantage of the present invention is that it is compatible with essentially any high resolution MRA imaging technique.

Another advantage of the present invention is that it avoids pre-saturation RF pulses. As a result, the specific absorption ratio (SAR) level is reduced. This is particularly advantageous in the case of imaging at high fields.

Another advantage of the present invention is that it takes advantage of the three-dimensional vascular connectivity during the vessel tracking and segmentation process by performing the vessel tracking in three-dimensional image space.

Another advantage of the present invention is that it combines a directional growth method with regional gray scale information to achieve faster and more accurate vascular segmentation and separation.

Yet another advantage of the present invention is that it improves the artery/vein separation effectiveness at locations where veins and arteries lack blood flow directional consistency.

Still yet another advantage of the present invention is that it makes vessel separation for contrast-enhanced MRA easier. The segmentation is less sensitive to temporal information and imaging parameters versus prior art techniques. Motion-related or time varying contrast-related artifacts can be identified and/or corrected.

Still further advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
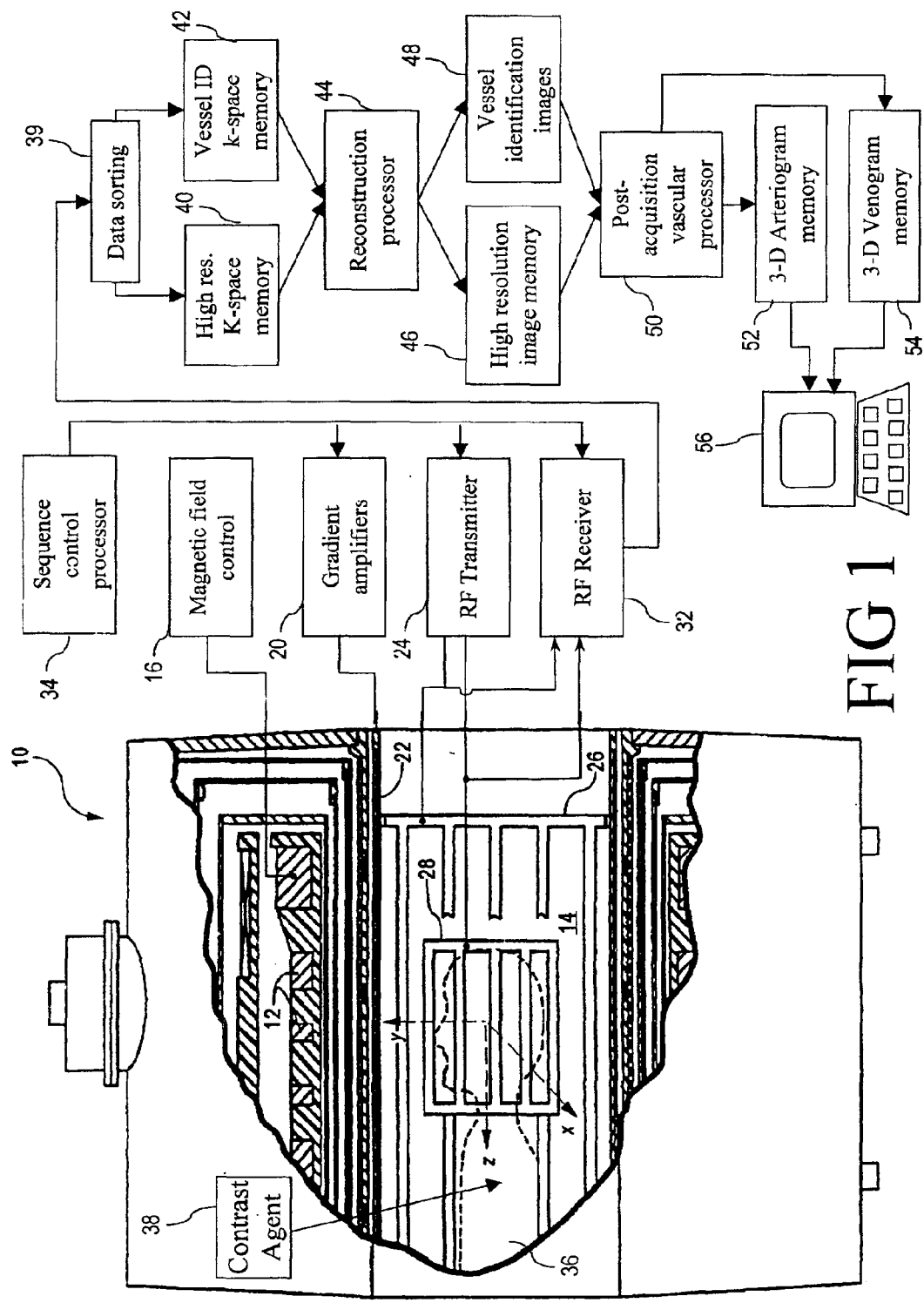
FIG. 1 shows an exemplary magnetic resonance angiography apparatus in accordance with a preferred embodiment of the invention.

With reference to FIG. 1, a magnetic resonance imaging (MRI) scanner 10 includes superconducting or resistive magnets 12 that create a substantially uniform, temporally constant main magnetic field $B_0$ along a z-axis through an examination region 14. Although a bore-type magnet is illustrated in FIG. 1, the present invention is equally applicable to open magnet systems, vertical field systems, and other types of MRI scanners. The magnets 12 are controlled by a main magnetic field control 16. Imaging is conducted by executing a magnetic resonance (MR) sequence with the subject being imaged, e.g. a patient 36 in a magnetic resonance angiography (MRA) session, placed at least partially within the examination region 14, typically with the region of interest at the isocenter.

The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region 14.

For whole-body applications, the resulting resonance signals, generated as a result of a selected manipulation, are also typically picked up by the whole-body RF coil 26. Alternately, for generating RF pulses in limited regions of the subject, local RF coils are commonly placed contiguous to the selected region. For example, as is known in the art, an insertable head coil 28 is inserted surrounding a selected brain region at the isocenter of the bore. Other surface coils or other specialized RF coils are also optionally employed. For example, the RF system optionally includes a phased array receive coil (not shown) whereby partial parallel imaging (PPI) techniques known to the art are employed. Preferably, the whole-body RF coil 26 induces resonance and the local RF coil or coil array receives magnetic resonance signals emanating from the selected region. In other embodiments, the local RF coil both excites and receives the resulting magnetic resonance signals.

Regardless of the RF coil configuration and the application thereof, the resultant RF magnetic resonance signals that are picked up by one or another of the RF coils are received and demodulated by an RF receiver 32. Preferably, a sequence control processor 34 controls at least the gradient pulse amplifiers 20, the RF transmitter 24, and the RF receiver 32 to produce integrated MRI pulse sequence and readout waveforms that generate the magnetic resonance (MR) signals and optional echoes, provide appropriate encoding gradients to spatially encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26, 28 result in magnetic resonance echoes that map into k-space.

In a magnetic resonance angiography (MRA) experiment, a patient 36 is imaged by the MRI system 10 using imaging conditions that particularly emphasize the vascular system in the resultant image. In the exemplary FIG. 1 the carotid area of the patient 36 is imaged. Optionally, the patient receives a magnetic resonance contrast agent 38, e.g. a bolus injection of a Gadolinium-Dithylene-Triamine-Penta-Acetate, to improve the vascular contrast, e.g. contrast-enhanced MRA is performed. An MRA sequence such as a time-of-flight (TOF) sequence, a black-blood angiography sequence, or the like, is applied by the sequence control processor 34. The sequence parameters for a preferred TOF embodiment include: TE=6.7 ms, TR=27 ms, FOV=20 cm, PE=192, NSA=1, flip-angle=35, gap=0 mm, and matrix size=384×512. Of course, those of ordinary skill in the art can tailor the pulse sequence program to generate better quality images for specific imaging situations using the image parameter control and type of weighting.

Although an exemplary MRA sequence is given above, it is to be appreciated that the disclosed invention is compatible with any MRA imaging method, including but not limited to non-contrast enhanced MRA, contrast enhanced MRA, TOF, white-blood MRA methods, black-blood MRA methods, T2-weighted MRA, and et cetera. Preferably, the MRA imaging method images both arteries and veins in an essentially non-selective manner.

In a preferred embodiment, an additional data acquisition of one or more slices that are used in vessel identification is performed. The resonance signals encoded for the additional one or more slices are preferably interspersed among the resonance signals for the high resolution MRA volume image slices. Preferably, the interspersed vessel identification image slices are of low resolution and high scan speed, and therefore have a negligible effect on the total patient imaging time. In a preferred embodiment, the additional data acquisition of one or more vessel identification slices is performed using a sequence that selectively images only one vascular type, e.g. selectively images only the arteries or selectively images only the veins.

The resultant magnetic resonance data is sorted 39 and stored in a high resolution k-space memory 40 that stores the high resolution 3-D data, and a vessel identification k-space memory 42 that stores the data corresponding to the at least one vessel identification slice. The k-space data 40, 42 is processed by a reconstruction processor 44, which is typically an inverse Fourier transform processor or other reconstruction processor known to the art. In a preferred embodiment, the reconstruction processor 44 produces a high resolution reconstructed image that is stored in an image memory 46. The reconstruction processor also produces one or more vessel identification images of the one or more interspersed slices corresponding to vessel identification images, which are stored in vessel identification images memory 48.

The high resolution MRA image is preferably a three-dimensional gray scale image representation of the examined area of the patient that has good contrast for the vascular system relative to other body tissues of the patient 36. However, the arterial and venous data is essentially undifferentiated from each other, and the high resolution MRA volume image representation 46 is unprocessed with respect to the vascular information contained therein. The one or more vessel identification slices are preferably of a lower resolution and selectively image either the arteries or the veins over the other vascular type.

A post-acquisition processor 50 processes the high resolution 3-D MRA volume image representation 46 in conjunction with the vessel identification slice images 48 to extract and/or highlight additional information about the imaged vascular system. The post processing preferably includes automated separation of the venous and arterial sub-systems, extraction of information about the blood vessel diameters and blood vessel networks, and the like. Automated separation of the arteries and the veins is advantageously enabled because the one or more interspersed vessel identification slices provide a key whereby the essentially undifferentiated arteries and veins of the high resolution image are separated.

The resulting arterial and venous information is preferably stored in a 3-D arteriogram memory 52 and a 3-D venogram memory 54, respectively. The vascular information can be graphically displayed on an appropriate user interface 56, and can of course also be stored electronically or on a magnetic storage medium, printed on paper, et cetera (not shown).

Figure 2:
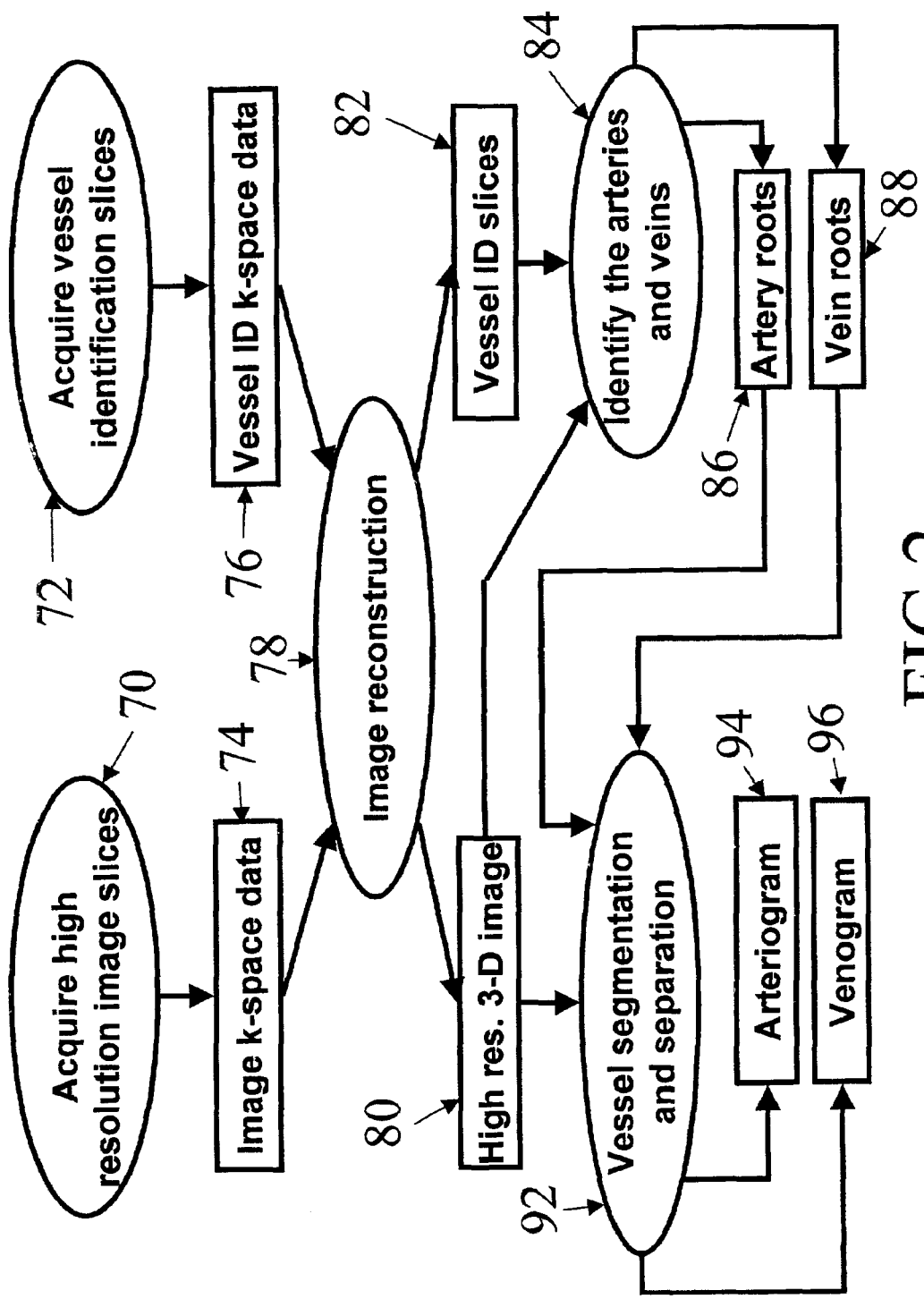
FIG. 2 shows an overview of an angiographic image reconstruction system in accordance with a preferred embodiment of the invention.

With continuing reference to FIG. 1 and with further reference to FIG. 2, a preferred embodiment of a process for producing separate arteriogram and venogram image representations is described. A high resolution volume, i.e. 3-D, MRA image is acquired in a step 70 using any known 2-D or 3-D imaging method that images both arteries and veins in an essentially non-preferential manner. In an exemplary embodiment, black-blood MRA imaging of the carotid region of the patient 36 is used. However, it is emphasized that the invention is not so limited, but rather is applicable to essentially any known two- or three-dimensional MRA imaging technique and to the imaging of essentially any body part. Optionally, a contrast agent 38 is used to improve the vascular contrast. The magnetic resonance imaging preferably follows the usual approach of acquiring a plurality of essentially spatially adjacent slices which are combinable to form a three dimensional image using an appropriate image reconstruction process.

In addition, data corresponding to at least one vessel identification slice is acquired in a step 72. Preferably, the data acquisition for the vessel identification slices is interspersed amongst the data acquisition for the high resolution 3-D image slices. The vessel identification slice imaging preferably uses an imaging method that selectively images only one of either the arteries or the veins. The acquisition 72 is also preferably fast, and can be a low resolution image since it is used only to identify the major vessels, e.g. the arterial roots or the venous roots.

Preferably, the vessel identification slices are acquired in the region where the roots of the targeted vascular system (arteries or veins) are located. Thus, for the exemplary carotid region, the acquisition 72 is preferably in the neck area where the roots of the carotid arteries and veins are arranged. However, because blood vessels can effectively terminate at various points in the body, e.g. at stenosis points, vessel identification slices are advantageously interspersed at a plurality of selected points along the slice-selective direction to ensure that any vascular sub-systems that are isolated, e.g. by a stenosis point, have at least one corresponding starting point in the vessel identification slices acquisition 72.

The acquisition 72 of data for the at least one vessel identification slice can be by any MRA method that selectively images the arteries preferentially over the veins, or that selectively images the veins preferentially over the arteries. The acquisition 72 advantageously employs a fast, low resolution imaging method. In a preferred embodiment, the vessel identification acquisition 72 employs a 2-D time-of-flight (TOF) MRA method with selective pre-saturation that selects either the arteries or the veins. The imaging time for a slice acquired using this method is typically of order one second, which is negligible compared with the total patient imaging time. However, it is re-emphasized that other methods can be used for the vessel identification acquisition 72, such as phase-contrast or magnitude contrast methods.

The acquisition 70 of the high resolution 3-D image data and the acquisition 72 of the vessel identification slices data produce image k-space data 74 stored in the memory 40 and vessel identification k-space data 76 stored in the memory 42, respectively. In an image reconstruction step 78, the k-space data sets 74, 76 are reconstructed by the reconstruction processor 44 to produce a high resolution 3-D image representation 80 which is stored in the high resolution image memory 46, and at least one vessel identification slice image representation 82 which is stored in the vessel identification images memory 48. Using the at least one vessel identification slice 82 and the high resolution 3-D image representation 80, the post-processor 50 identifies one or more artery roots 86 and one or more vein roots 88. Using the starting points 86, 88, the vascular system is segmented and separated in a step 92 to generate the arteriogram 94 which is stored in the arteriogram memory 52, and the venogram 96 which is stored in the venogram memory 54.

Figure 3:
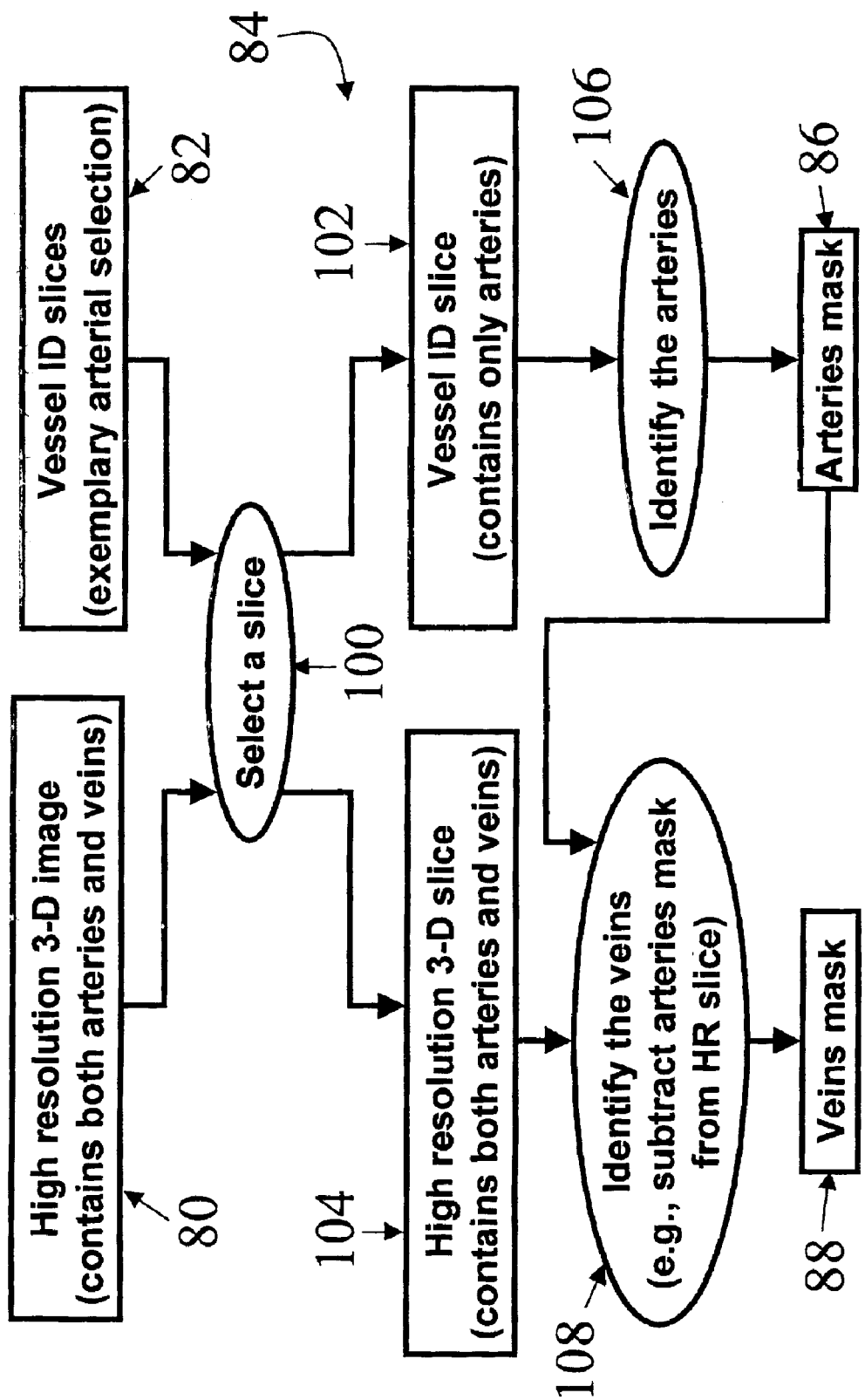
FIG. 3 shows a method for differentiating arteries and veins in accordance with a preferred embodiment of the invention.

With continuing reference to FIG. 2 and with further reference now to FIG. 3, a preferred method for the step 84 of identifying the arteries and the veins is described. A vessel identification slice 102 is selected from the one or more vessel identification slices 82 in a step 100. The vessel identification slice 102 advantageously selectively images only one of the arteries or the veins. In the illustrated exemplary embodiment of FIG. 3, the vessel identification slice 102 is taken as selectively imaging the arteries. Because the vessel identification slices 82 are preferably interspersed in amongst the slices of the 3-D high resolution image 80, there advantageously exists a high resolution slice 104 selected from the high resolution image 80 that closely corresponds spatially to the vessel identification slice 102. For example, in the case of MRA imaging of the carotid region, axially oriented slices that are perpendicular to the z-direction are typically acquired. Thus, for the selected vessel identification slice 102, a search is made of the slices comprising the high resolution 3-D image 80 for that slice 104 which has the same, or nearly the same, z-coordinate as the vessel identification slice 102. It will be appreciated that the high resolution image 80 and thus the high resolution corresponding slice 104 preferably image both arteries and veins in essentially undifferentiated form, as discussed previously with reference to FIGS. 1 and 2

With continuing reference to FIG. 3, the selected vessel identification slice 102 is preferably analyzed by any suitable image processing technique to identify 106 the arteries contained therein. Since the vessel identification slice 102 preferably contains only one vessel type, the analysis is greatly simplified as vessel type-differentiation is not involved. In this manner, artery roots or an arteries mask 86 is obtained. Of course, in the case of a vein-selective vessel identification slice, the veins would preferably be identified in a step analogous to the step 106.

In a step 108, the selected high resolution 3-D slice 104, which contains both arteries and veins, is analyzed by comparison with the identified arteries 86, e.g. by effectively subtracting the arteries mask 86 from the high resolution slice 104, to identify the veins contained therein. In this manner, vein roots or a veins mask 88 is obtained.

Because the vessel identification slices acquisition 72 is interspersed with the acquisition 70 of the high resolution image, the spatial registry of the vessel identification slice 102 with the high resolution slice 104 is typically straightforward as there is a low probability of the patient moving significantly between the acquisition of the slices 102, 104. To further improve the image registration, in a preferred embodiment the vessel identification slice 102 corresponds to the same (within mechanical tolerances) plane as the high resolution slice 104, i.e. for the exemplary carotid imaging the slices 102, 104 are taken at the same axial plane, e.g. the same z-coordinate value, with consecutive or, better yet, interleaved data acquisition.

The steps 100, 106, and 108 are preferably repeated for each of the at least one vessel identification slices 82. In this manner, a plurality of arterial starting points 86 and venous starting points 88 are obtained. It will be recognized that the interspersing of the slices 82 is preferably weighted toward the regions of the vascular roots, e.g. in the lower neck area for the exemplary carotid MRA session. However, due to the possibility of stenosis and other complications to the blood vessel tracking process 92, the at least one vessel identification slice 82 preferably includes a plurality of slices that are arranged to provide additional starting points away from the vascular roots to enable tracking of discontinuous vasculature.

In an alternate contemplated embodiment (not shown) of the vessel type identification step 84, a plurality of vessel identification slices are acquired, in which some slices are artery-selective while other slices are vein-selective. In this alternate embodiment the slice selection and analysis steps 100, 106 are repeated for each vessel identification slice in turn. Starting points or roots for both arteries and veins are thereby obtained without recourse to the step 108 that involves analysis of a corresponding high-resolution slice from the 3-D image 80.

With reference returning now to FIG. 2, once starting locations 86, 88 for artery or veins are identified in the step 84, the 3-D arterial or venous tree is estimated by vessel segmentation and separation in a step 92 using any applicable post-processing technique. Since the volume acquisition 70 generates three-dimensional volume image data 80, the tracking preferably takes advantage of the 3-D connectivity information about the vascular tree that is contained in the 3-D volume 80 for building direct 3-D segmentation.

Figure 4:
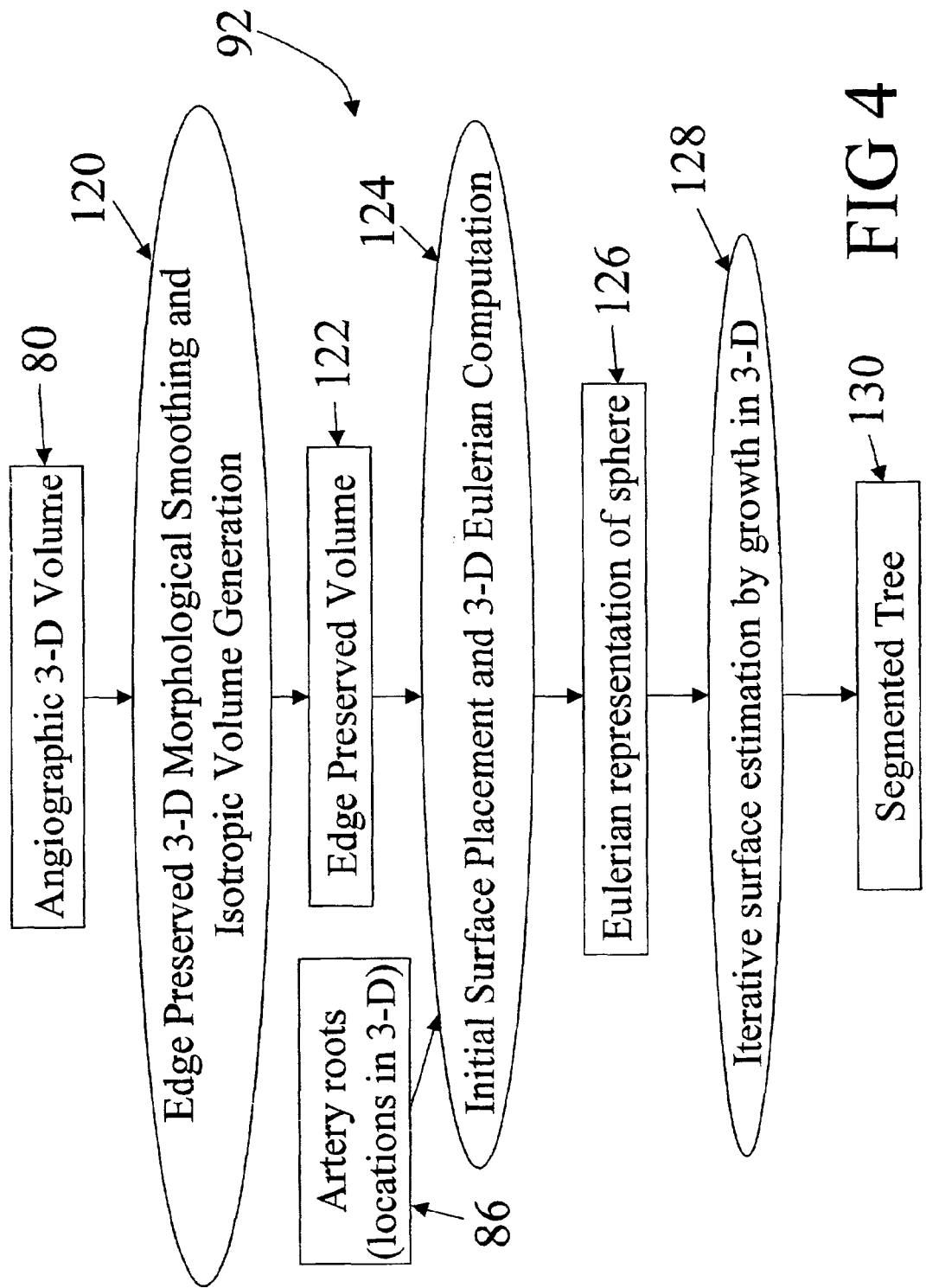
FIG. 4 shows a method for vessel segmentation and separation in accordance with a preferred embodiment of the invention.

With reference now to FIG. 4, a preferred embodiment of the vessel segmentation and separation step 92 is described, in which seeds corresponding to the starting locations 86, 88 are grown three-dimensionally in an edge-preserved volume 122 to estimate the vascular system. In an analogy to fluid flow wherein the fluid flows along the path of least resistance, the growth process follows the paths of least resistance which correspond to the vascular regions. Preferably, the edge-preserved volume 122 is generated from the high resolution 3-D angiographic image 80 using an edge-preserved 3-D morphological smoothing and isotropic volume generation step 120. Preservation of the edges in 3-D occurs using a the 3-D mathematical morphology, thus advantageously incorporating the 3-D vascular connectivity information into the smoothing process.

The initial starting points 86, 88 are used in a step 124 to spatially define and position initial vascular surfaces within the 3-D edge-preserved volume 122. FIG. 4 shows exemplary tracking of the arteries, and thus the artery starting points 86 are supplied. Of course, for tracking the venous system the veins starting points 88 would be supplied to the initial surface placement step 124 instead. In one embodiment the tracking process 92 is sequentially repeated to generate the arteriogram 94 and venogram 96. In another embodiment, the arteriogram 94 and venogram 96 are computed essentially simultaneously by running the tracking process 92 applied to the arteries and the veins essentially in parallel.

Figure 5:
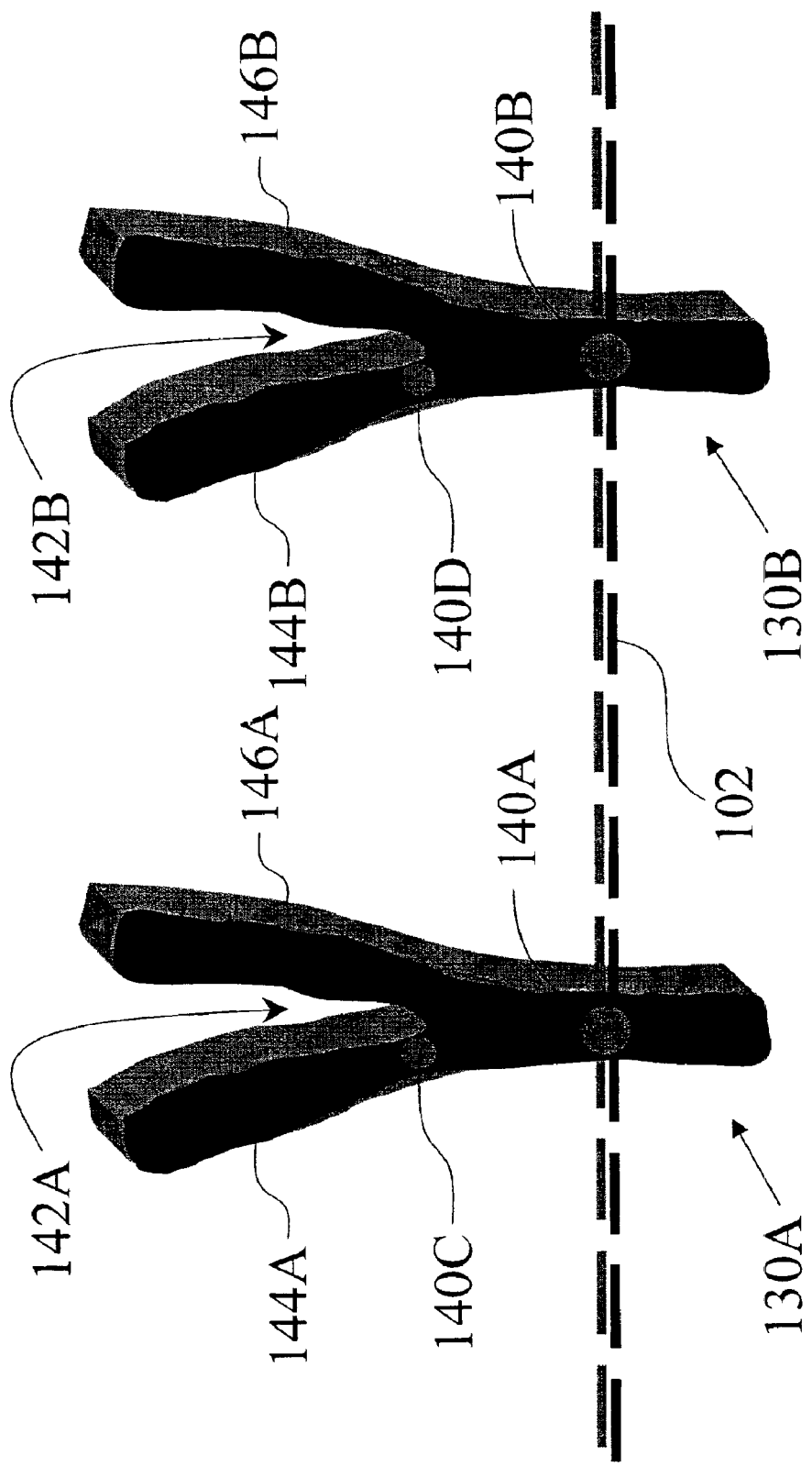
FIG. 5 shows an exemplary vascular system having multiple arterial starting points in the vessel identification slice as well as two bifurcation points.

With continuing reference to FIG. 4 and with further reference to FIG. 5, using an iterative vascular growth process 128 the segmented vascular tree 130 is estimated by growing the initial vascular surfaces iteratively. In a simple growing technique, the voxels surrounding each seed voxel are searched to identify those voxels with like, within preselected tolerances, gray scales. This process is repeated for the voxels surrounding each identified voxel of like gray scale to effectuate the iterative growing. In a typical situation, e.g. the illustrated exemplary growth of the arterial vascular system tree 130, a plurality vascular subsystems are typically grown either simultaneously or sequentially. FIG. 5 shows portions of two exemplary arterial vascular subsystems 130A, 130B that are being grown from initial artery surfaces 140A, 140B that were positioned based on information extracted from the artery-selective vessel identification slice 102, e.g. according to the step 106 of FIG. 3.

Typically, as a vascular system is mathematically grown, bifurcation points are encountered, e.g. exemplary bifurcation points 142A, 142B shown in FIG. 5. The bifurcation points and their 3-D locations are noted, e.g. by placing new initial surfaces 140C, 140D at the start of a branch 144A, 144B of each bifurcation, and growth continues along a branch 146A, 146B of the bifurcation. The noted 3-D locations are visited again and the growth process is re-initiated at the starting surfaces 140C, 140D so that growth continues along the previously untraced branches 144A, 144B.

The process of tagging vascular branches, continuing along one branch and subsequently returning to the tagged branch and re-initiating the growth process 124, 126 continues until every tagged branch has been visited and the vascular tree has been completely tracked. The growth process is done in the neighborhood of the seeds 140, so the system is fast and robust. The neighborhood is user controlled and can vary from 3 to 5 voxel layers on both sides of the edge-growth boundary. Of course, it will also be appreciated that an essentially analogous process to the step 92 is preferably applied to track the venous tree, and situations such as multiple starting surfaces, bifurcation points, and the like, are encountered when tracing the veins as well.

With reference returning now to FIG. 4, a preferred embodiment for the process 120 that generates the edge-preserved volume 122 is described. Typically, the angiographic 3-D volume 80 is re-segmented to form a volume comprising isotropic voxels. The acquired angiographic data 80 is usually aligned along the conventional orthogonal axial, sagittal, and coronal planes of the body. In the exemplary case of MRA imaging of the carotid vascular system, the image slices are typically axially-oriented slices, and the phase-encoding and readout directions are in the axial plane lying along one or the other of the sagittal and coronal directions. Each voxel is thus orthorhombic with sides in the axial, sagittal, and coronal planar orientations, but the acquired voxels are typically not cubic. The voxels are therefore re-segmented to produce isotropic data for which the voxels are cubic. The subsequent mathematical data manipulations are preferably applied to isotropic data. It will be recognized by those skilled in the art that similar re-segmenting is applicable to MRA data acquired along planes that are not coincident with the conventional axial, sagittal, and coronal planes of the body.

With continuing reference to FIG. 4, in a preferred embodiment the 3-D edge preservation system 120 is implemented by running mathematical morphological tools in three dimensions over the isotropic volume. This can be done by running a combination of fundamental mathematical morphological tools like dilation, erosion, opening and closing in 3-D space.

Defining I as the image signal and S as a structuring element, a gray scale dilation is preferably defined in two dimensions as:

$$(I \oplus S)(x, y) = \max_{i,j} \{I(x-i, y-j) + S(i, j)\}. \tag{1}$$

The gray scale dilation has a property of enlarging geometric structures in an image.

The gray scale erosion is preferably defined in two dimensions as:

$$(I \ominus S)(x, y) = \min_{i,j} \{I(x+i, y+j) - S(i, j)\}. \tag{2}$$

Gray scale erosion has a property of shrinking geometric structures in an image.

The gray scale opening and the gray scale closing can be done by combining the gray scale morphological operations of dilation and erosion as given in equation (1) and equation (2), respectively. The gray scale closing operation is preferably written as:

$$I \bullet S = (I \oplus S) \ominus S \tag{3},$$

and the gray scale opening operation is preferably written as:

$$I \circ S = (I \ominus S) \oplus S \tag{4}.$$

Figure 6:
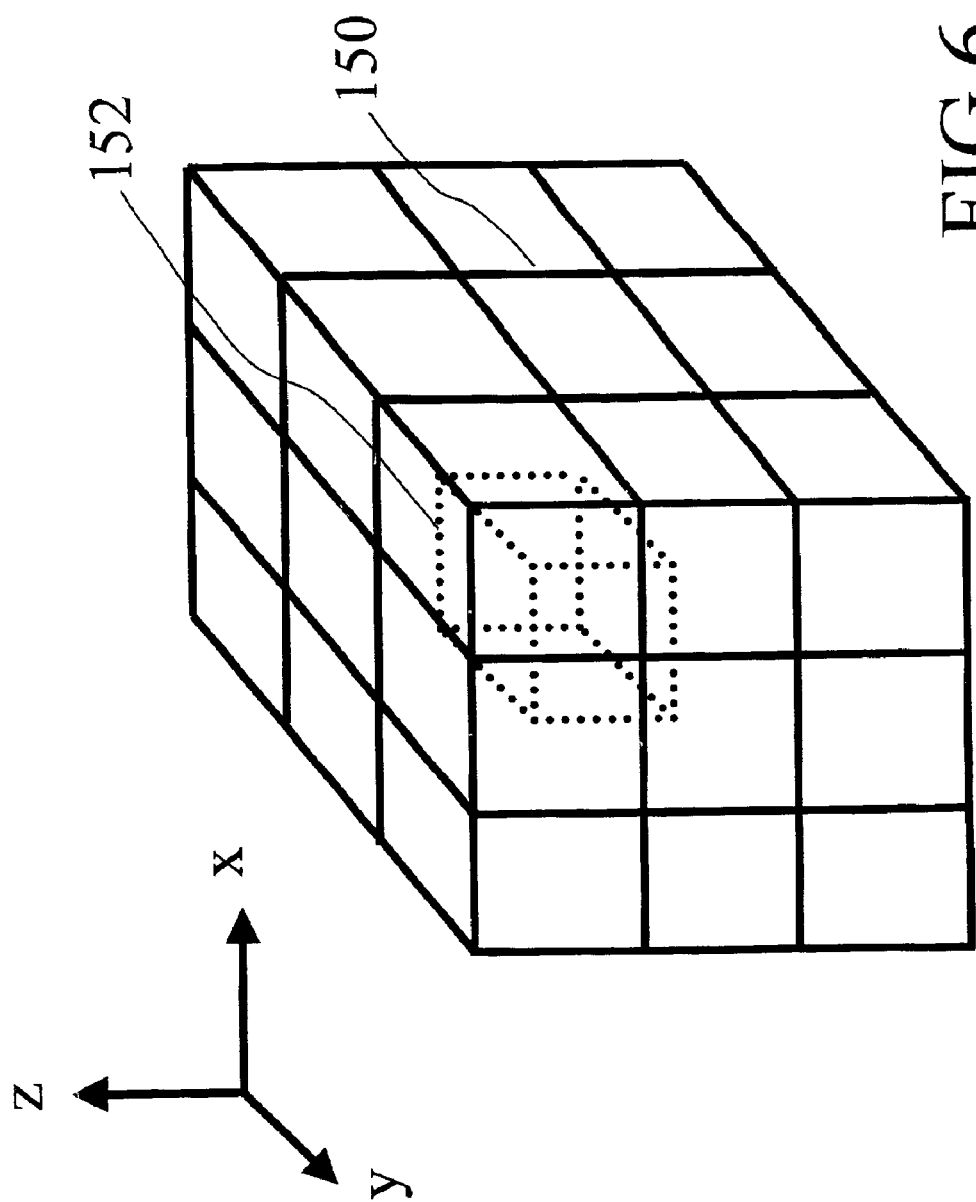
FIG. 6 shows an exemplary geometric configuration for the gray scale smoothing process.

With reference to FIG. 6, the above four fundamental equations of gray scale mathematical morphology in 2-D can be extended to three dimensions to implement the step 120 of generating the edge-preserved smoothed 3-D volume 122. This is done by extending the two-dimensional expressions of equation (1) through equation (4) to three dimensions as is known to those of ordinary skill in the art. An exemplary portion of the isotropic 3-D volume 150 before morphological smoothing along with an exemplary 3-D structuring element 152 are shown in FIG. 6. A significant advantage of the above technique is that very small vessels are typically preserved while the noise is essentially removed. Since the operations are in 3-D, the topology of the vessels is preserved during the removing of the noise, and the 3-D vascular connectivity is advantageously incorporated by performing the edge-preserved smoothing in 3-D.

Figure 7:
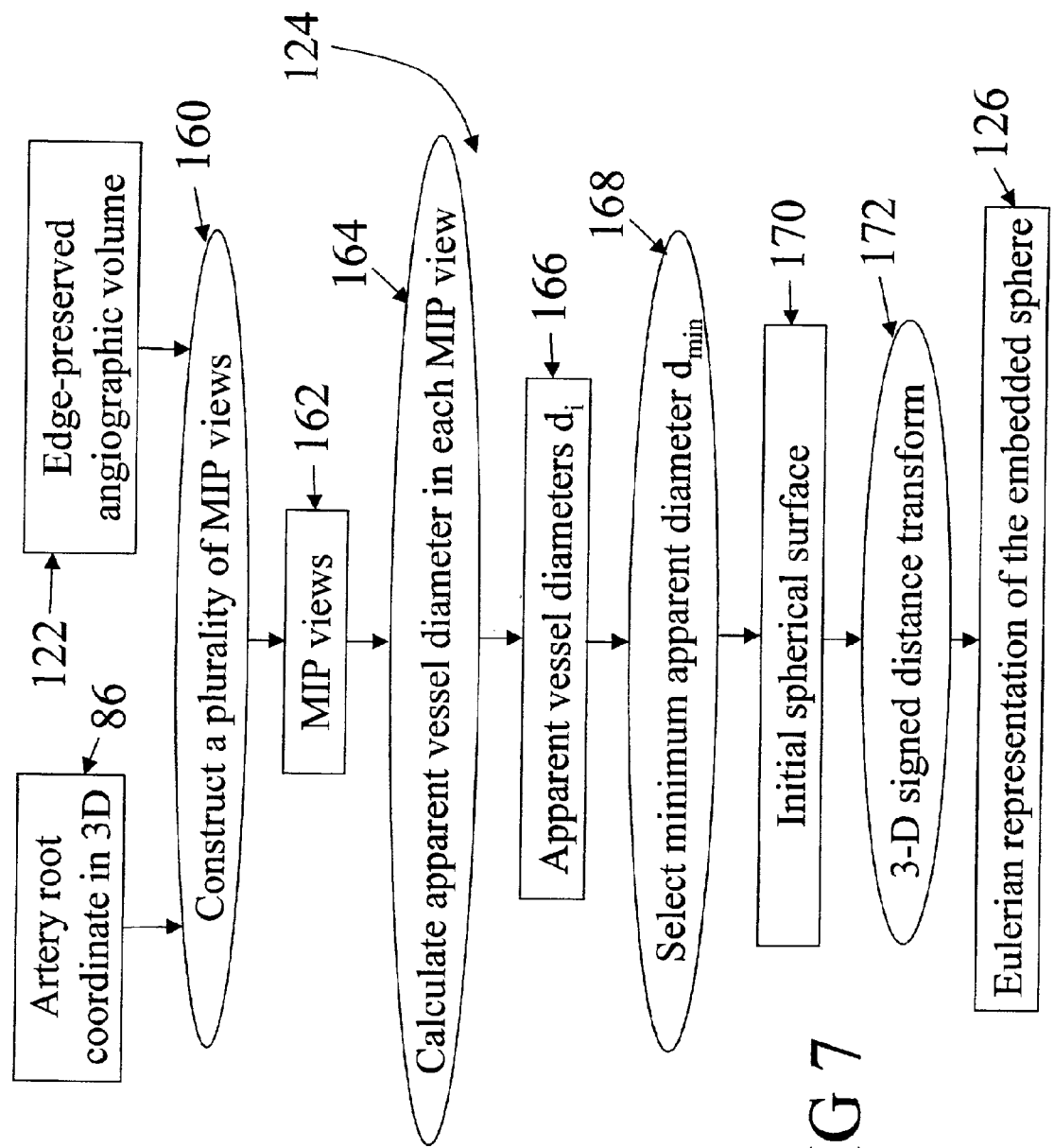
FIG. 7 shows a method for obtaining an initial Eulerian representation of a starting spherical surface corresponding to a vascular starting point in accordance with a preferred embodiment of the invention.

With continuing reference to FIG. 4 and with further reference now to FIG. 7, a preferred embodiment for the step 124 of generating the initial vascular surfaces and computing a 3-D Eulerian representation 126 is described. The initial surfaces serve as seeds for mathematical vessel growth in the smoothed three-dimensional volume 122. Preferably, spherical surfaces are inserted at the 3-D locations of the artery roots 86. (Of course, for venous tracking, the vein roots 88 would be used instead). A plurality of Maximum Intensity Projection (MIP) views of the vascular root 86 is constructed in a step 160. The MIP views 162 are preferably taken along a plurality of orthogonal projections, with the location 86 of the artery root identified in each MIP view 162. The radius of a 3-D sphere centered at the artery root location (x,y,z) is computed from the MIP views as follows.

The apparent diameter of the artery root 86 is calculated in each MIP view in a step 164 to generate a plurality of apparent vessel diameters 166. The minimum apparent (MIP) diameter $d_{min}$ is selected 168, and a spherical surface 170 is defined as a sphere formed about the artery root coordinate 86 that has a radius $r=d_{min}/2$. If the number of MIP views or projections 162 of the artery root 86 located at coordinates (x,y,z) is n, then the radius r of the sphere 170 is preferably computed as:

$$r = \frac{1}{2} \min\{d_1, d_2, \ldots, d_n\}, \tag{5}$$

where $d_1, d_2, \ldots d_n$ are the apparent diameters 166 of the vessel root 86 in the n MIP views 162. The use of a fairly large number of MIP views 162 along with the application of the minimum apparent diameter $d_{min}$ in calculating the initial spherical surface 170 greatly reduces the likelihood that the selected spherical surface 170 improperly includes a region that lies outside the vascular area. Since the mathematical vascular growth to be described next initiates at the initial surface, an overestimated initial surface will typically result in an erroneously large vascular diameter at the point of the initial surface 170. Those skilled in the art can use MIP projections 162 corresponding sagittal, coronal, or axial view data sets to generate 3n MIP views 162. A good range of n is 6. A large number of rotations can also be used for computing additional MIP views to further reduce the possibility of overestimating the initial radius r.

With continuing reference to FIG. 7, the initial sphere 170 is converted into a Eulerian representation 126 by computing the signed distance transform 172 of the sphere 170. The signed distance transform 172 is a process where a voxel is assigned a +ve or −ve distance value from the edge of the sphere 170. For example, the first inside layer of the sphere 170 is given a +ve one value while the first outside layer of the sphere is given a −ve one value. In like manner all the voxels in the neighborhood are assigned signed distance values ±d, where d is the distance from the sphere edge. The result of the transform 172 is typically called the Eulerian representation of the embedded sphere 126.

Figure 8:
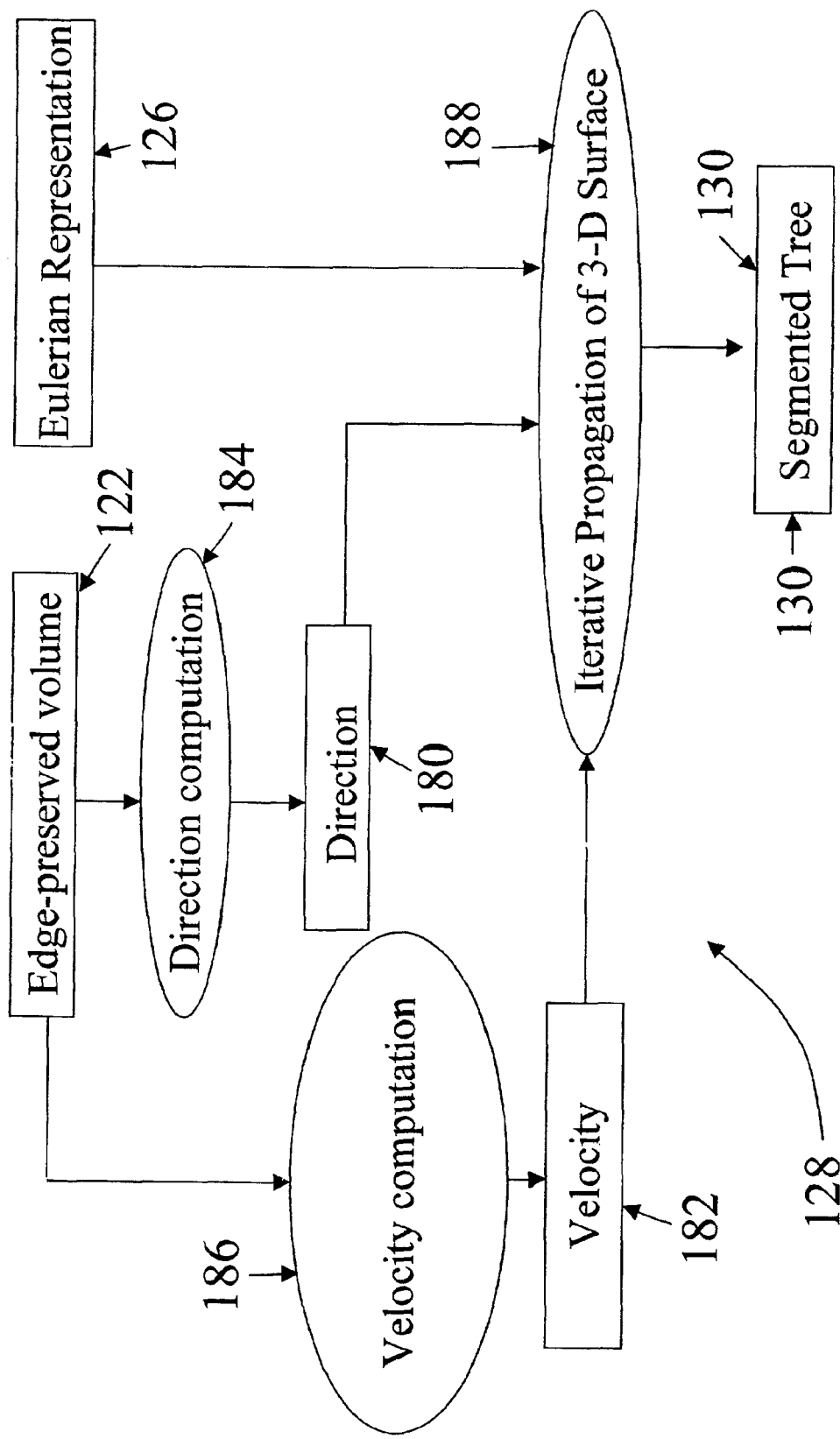
FIG. 8 shows a method for iteratively growing the vascular system in the edge-preserved volume in accordance with a preferred embodiment of the invention.

With reference now to FIG. 8, a preferred embodiment of the iterative surface estimation by 3-D growth process 128 is described. The step 128 essentially includes growing the initial surface 170 three dimensionally based on voxel connectivity and the 3-D gray scale volume distribution. The iterative surface process has two major components: a directionality component 180 and an integrated velocity component 182 corresponding to the speed at which the surface grows. The directionality component 180 is computed using eigenvectors of computed 184 Hessian matrices. The minimum eigenvalue of the three-dimensional Hessian matrices give the directional component 180 of computation of the 3-D growth process. In a preferred embodiment, noise interference in the computation 184 of the directional component 180 is limited by convolving the morphological volume 122 with a higher order derivative of a Gaussian operator (not shown) before the directional computation 184.

The speed of growth or integrated velocity 182 is computed 186 by estimating the edge, region and gradient information of the region which is around the surface or growth volume. The edge, region, and gradient speed components are integrated in the level set framework for the growth process. The iterative propagation of the 3-D surface 188 occurs in the directions 180 according to the calculated integrated velocity 182 to mathematically grow the vascular system in the 3-D edge preserved volume 122. In this manner, directional growth is combined with the gray scale regional information that controls the growth velocity. The directional component is thus fused with the statistical edge information and the gradient information contained in the edge-preserved smoothed volume 122 to rapidly and accurately mathematically grow the vascular system from the initial Eulerian representation of the embedded sphere 126.

As the 3-D vessels grow, bifurcation points are typically encountered, e.g. the bifurcation points 142A, 142B shown in FIG. 5. As previously discussed with reference to FIG. 5, the 3-D location of one branch of the bifurcation point, e.g. 144A, 144B is tagged and growth continues down the other branch, e.g. 146A, 146B. The tagged locations are visited again and the growth process 124, 128 is re-initiated at each tagged point in turn.

Because the growth process is restricted to the neighborhood of the surface, the growth process 128 is fast and robust. The neighborhood is preferably user controlled and typically varies between 3 and 5 voxel layers on each side of the edge-growth boundary.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance angiographic method including:
   acquiring high resolution volume image data comprising data corresponding to a high resolution image volume;
   reconstructing a high resolution volume image representation from the acquired high resolution volume image data;
   with a flow-sensitive imaging sequence, acquiring data corresponding to at least one vessel identification image slice, said acquired data having selectively enhanced contrast for one of arteries and veins;
   reconstructing at least one vessel identification slice image representation indicative of flow direction from the acquired data corresponding to at least one vessel identification image slice;
   basing the identifying at least one of an artery starting point and a vein starting point in the high resolution image on the flow direction indication in the vessel identification slice image representation;
   growing the starting point to define a vascular map.

2. The magnetic resonance angiographic method as set forth in claim 1, wherein:
   the step of acquiring data corresponding to at least one vessel identification image slice is interspersed in amongst the acquiring of the high resolution volume image data.

3. The magnetic resonance angiographic method as set forth in claim 1, wherein the step of acquiring data corresponding to at least one vessel identification image slice includes one of:
   acquiring data using selective pre-saturation to provide the selectively enhanced contrast for one of arteries and veins; and
   acquiring time-of-flight MRA data using selective pre-saturation to provide the selectively enhanced contrast for one of arteries and veins.

4. The magnetic resonance angiographic method as set forth in claim 1, wherein the step of acquiring data corresponding to at least one vessel identification image slice includes:
   acquiring the at least one vessel identification image slice at a data acquisition rate corresponding to less than or about one second per slice.

5. The magnetic resonance angiographic method as set forth in claim 1, wherein the step of acquiring data corresponding to at least one vessel identification image slice includes:
   acquiring data in a region corresponding to a root of one of an artery and a vein.

6. The magnetic resonance angiographic method as set forth in claim 1, wherein the step of identifying at least one of an artery starting point and a vein starting point based on the vessel identification slice image representation includes:
   identifying at least one vein starting point based on the vessel identification slice image representation; and
   identifying at least one artery starting point based on comparing the high resolution image slice that corresponds spatially with the vessel identification slice image representation with at least one of the vessel identification slice image representation and the at least one vein starting point.

7. The magnetic resonance angiographic method as set forth in claim 1, wherein the step of acquiring of data corresponding to at least one vessel identification image slice includes:
   acquiring data corresponding to a plurality of vessel identification slices, said vessel identification slices being interspersed at a plurality of selected points.

8. The magnetic resonance angiographic method as set forth in claim 1 further including:
   defining an initial surface that encloses the at least one starting point; and growing the starting point includes:
   iteratively growing the initial surface until the surface conforms with the boundaries of the vascular system.

9. The magnetic resonance angiographic method as set forth in claim 8, wherein the step of defining an initial surface that encloses the at least one starting point includes:
   computing a plurality of maximum intensity projections (MIP's);
   computing the apparent diameter of a vessel corresponding to the starting point in each of the MIP's;
   selecting the minimum apparent diameter; and defining the initial surface as a spherical surface centered on the starting point whose radius is about one-half the selected minimum apparent diameter.

10. The magnetic resonance angiographic method as set forth in claim 8, wherein the step of iteratively growing the initial surface until the surface essentially coincides with the boundaries of the vascular system includes:
calculating a growth direction;
integrating a growth velocity based on regional gray scale information;
moving the surface in the growth direction by a distance corresponding to the growth velocity; and
repeating the calculating, integrating, and moving until the surface conforms with the boundaries of the vascular system.

11. The magnetic resonance angiographic method as set forth in claim 10, wherein the step of calculating a growth direction includes:
calculating at least one Hessian matrix:
calculating eigenvalues and cigenvectors of the at least one Hessian matrix; and
calculating the growth direction as the direction corresponding to the minimum eigenvalue.

12. The magnetic resonance angiographic apparatus according to claim 6, wherein the post-acquisition vascular processor further identifies both the artery starting point and the vein starting point and grows distinct veins and arterial vascular trees from the vein starting point and the artery starting point.

13. A magnetic resonance angiographic method including:
acquiring high resolution volume image data comprising data corresponding to a high resolution image volume;
reconstructing a high resolution volume image representation with a plurality of slices from the acquired high resolution volume image data;
acquiring data corresponding to at least one vessel identification image slice which corresponds spatially with one of a plurality of slices of the high resolution image, the vessel identifying data differentiating between vessels and arteries;
reconstructing the vessel indentifying data into a vessel indentifying slice;
comparing the vessel indentifying slice with a spatially corresponding slice of the high resolution image;
based on the comparing, identifying one of an artery starting point and a vein starting point in the high resolution image.

14. The magnetic resonance angiographic method as set forth in claim 13, wherein the acquisition of data for the indentification image slice and the acquisition of data for the corresponding high resolution image slice are interspersed.

15. The magnetic resonance angiographic method as set forth in claim 13, wherein the step of identifying at least one of an artery starting point and a vein starting point based on the vessel identification slice image representation includes:
identifying at least one artery starting point based on the vessel identification slice image representation and;
identifying at least one vein starting point based on comparing the high resolution image slice that corresponds spatially with the vessel identification slice image representation with at least one of the vessel identification slice image representation and the at least one artery starting point.

16. The magnetic resonance angiographic method as set forth in claim 13, further comprising:
tracking in three dimensions the vascular sub-system starting at the at least one starting point.

17. A magnetic resonance angiographic apparatus including a vascular processor for performing the method of claim 13.

18. A magnetic resonance angiographic method comprising:
acquiring high resolution volume image data including data corresponding to a high resolution image volume;
reconstructing a high resolution volume image representation from the acquired high resolution volume image data;
identifying an artery starting point or a vein starting point in the high resolution image;
defining an initial surface that encompasses the at least one starting point; and
iteratively growing the initial surface in three dimensions until the surface essentially coincides with the boundaries of the vascular system.

19. The magnetic resonance angiographic method as set forth in claim 18, wherein the step of defining an initial surface that encompasses the at least one starting point includes:
computing a plurality of maximum intensity projections (MIP's);
computing the apparent diameter of a vessel corresponding to the starting point in each of the MIP's;
selecting the minimum apparent diameter; and
defining the initial surface as a spherical surface centered on the starting point whose radius is about one-half the selected minimum apparent diameter.

20. The magnetic resonance angiographic method as set forth in claim 18, wherein the step of iteratively growing the initial surface until the surface essentially coincides with the boundaries of the vascular system includes:
calculating a growth direction;
integrating a growth velocity based on regional gray scale information;
moving the surface in the growth direction by a distance corresponding to the growth velocity; and
repeating the calculating, integrating, and moving until the surface essentially coincides with the boundaries of the vascular system.

21. The magnetic resonance angiographic method as set forth in claim 20, wherein the step of calculating a growth direction includes:
calculating at least one Hessian matrix;
calculating eigenvalues and eigenvectors of the at least one Hessian matrix; and
calculating the growth direction as the direction corresponding to the minimum eigenvalue.

22. The magnetic resonance angiographic method as set forth in claim 18, further comprising:
smoothing the high resolution volume image representation using an edge-preserving three-dimensional gray scale smoothing method.

23. The magnetic resonance angiographic method as set forth in claim 18, further comprising:
encountering, during the iterative growing, a vascular branching point having a first branch and at least one additional branch;
tagging a point corresponding to the at least one additional branch;
continuing the iterative growing along the first branch;

returning to the tagged point and repeating the steps of defining an initial surface and iteratively growing the initial surface at the tagged point wherein the iterative growing occurs along the at least one additional branch; and repeating the returning step until all tagged points have been visited.

24. The magnetic resonance angiographic method as set forth in claim 18, further comprising:

smoothing the high resolution volume image representation using an edge-preserving three-dimensional gray scale smoothing method.

25. A magnetic resonance angiographic apparatus including a vascular processor for performing a method of claim 18.

26. A magnetic resonance angiographic method comprising:

acquiring high resolution volume image data comprising data corresponding to a high resolution image volume;

reconstructing a high resolution volume image representation from the acquired high resolution volume image data;

acquiring data corresponding to at least one vessel indentification image slice, said acquired data having selectively enhanced contrast for one of arteries and veins relative to the other;

reconstructing at least one vessel identification slice image representation from the acquired data corresponding to at least one vessel identification image slice;

identifying an artery starting point and a vein starting point in the high resolution image based on the vessel identification slice image representation; and growing distinct veinus and arterial vascular trees from the vein starting point and the artery starting point.

27. The magnetic resonance angiographic method as set forth in claim 26, wherein the step of acquiring data corresponding to at least one vessel indentification image slice includes:

acquiring data corresponding to at least one vessel identification image wherein said data acquiring is interspersed in amongst the acquiring of the high resolution volume image data.

28. The magnetic resonance angiographic method as set forth in claim 26, wherein the step of acquiring data corresponding to at least one vessel identification image slice includes one of:

acquiring data using selective pre-saturation to provide the selectively enhanced contrast for one of arteries and veins; and acquiring time-of-flight MRA data using selective pre-saturation to provide the selectively enhanced contrast for one of arteries and veins.

29. A magnetic resonance angiographic method as set forth in claim 26, wherein the step of acquiring data corresponding to at least one vessel identification image slice includes:

acquiring data corresponding to at least one vessel identification image slice wherein the acquired vessel identification image slice corresponds spatially with a slice of the high resolution image representation.

30. The magnetic resonance angiographic method as set forth in claim 29, wherein the step of identifying at least one of an artery starting point and a vein starting point based on the vessel identification slice image representation includes:

identifying at least one starting point of a first vessel type corresponding to one of an artery a vein based on the vessel identification slice image representation; and identifying at least one starting point corresponding to a second vessel type based on comparing the vessel identification slice image representation with the corresponding high resolution image slice.

31. The magnetic resonance angiographic method as set forth in claim 26, wherein the step of acquiring data corresponding to at least one vessel identification image slice includes:

acquiring data corresponding to a plurality of vessel identification slices, said vessel identification slices being disposed in at least one different locations and orientations within the high resolution image volume.

32. A magnetic resonance angiography apparatus comprising:

a magnetic resonance apparatus for acquiring magnetic resonance angiographic data for generating high resolution volume angiographic k-space data and low resolution two-dimensional vessel identification angiographic k-space data;

a reconstruction processor that reconstructs the volume angiographic k-space data into a high resolution three-dimensional image representation, and that reconstructs the two-dimensional vessel identification angiographic k-space data into a vessel identification slice image representation which corresponds spatially to a slice of the high resolution volume image; and a post-acquisition vascular processor for:

identifying one of an artery starting point and a vein starting point in the vessel identification slice image representation, and from a point in the high resolution image corresponding spatially with the identified starting point in the vessel identification slice image representation growing one of a three-dimensional arteriogram and a three-dimensional venogram.

33. The magnetic resonance angiography apparatus as set forth in claim 32, further comprising:

a means for administering a magnetic contrast agent to an associated patient, whereby the acquired magnetic resonance angiographic data includes contrast-enhanced magnetic resonance angiographic data.

34. The magnetic resonance angiography apparatus according to claim 32, wherein the vessel identification slice image indicates flow direction and wherein the post-acquisition vascular processor identifies the starting point based on the flow direction indicated in the vessel identification slice image representation.

35. The magnetic resonance angiography apparatus according to claim 32, wherein the post-acquisition vascular processor further compares the vessel identification slice image representation with a spatially corresponding slice of the high resolution image representation and, based on the comparing, identifies the starting point in the high resolution image.

36. The magnetic resonance angiography apparatus according to claim 32, wherein the post-acquisition vascular processor identifies an initial surface that enclosed the starting point and itertively grows the initial surface until the surface essentially coincides with boundaries of the vascular system.

37. A magnetic resonance angiographic apparatus comprising:

a means for acquiring high resolution volume image data comprising data corresponding to a high resolution image volume;

a means for reconstructing a high resolution volume image representation from the acquired high resolution volume image data;

a means for identifying one of an artery starting point and a vein starting point in the high resolution image;

a means for defining an initial surface that encloses the at least one starting point; and a means for iteratively growing the initial surface in three dimensions until the surface essentially coincides with the boundaries of the vascular system.

38. A magnetic resonance angiographic apparatus comprising:

a means for acquiring high resolution volume image data comprising data corresponding to a high resolution image volume;

a means for reconstructing a high resolution volume image representation from the acquired high resolution volume image data;

a means for acquiring data corresponding to at least one vessel identification image slice, said acquired data having selectively enhanced contrast for one of arteries and veins relative to the other;

a means for reconstructing at least one vessel identification slice image representation from the acquired data corresponding to at least one vessel identification image slice; and a means for identifying an artery starting point or a vein starting point based on the vessel identification slice image representation.

\* \* \* \* \*